United States Patent
Engel

(10) Patent No.: US 11,498,442 B2
(45) Date of Patent: Nov. 15, 2022

(54) SYSTEMS AND METHODS FOR NOISE CANCELLATION IN PROTECTIVE EARTH RESISTANCE CHECK OF VEHICLE ONBOARD BATTERY CHARGER

(71) Applicant: Dr. Ing. h.c. F. Porsche Aktiengesellschaft, Stuttgart (DE)

(72) Inventor: Joseph A. Engel, Differdange (LU)

(73) Assignee: Dr. Ing. h.c. F. Porsche Aktiengesellschaft, Stuttgart (DE)

( * ) Notice: Subject to any disclaimer, the term of this patent is extended or adjusted under 35 U.S.C. 154(b) by 307 days.

(21) Appl. No.: 16/572,907

(22) Filed: Sep. 17, 2019

(65) Prior Publication Data

US 2021/0078430 A1    Mar. 18, 2021

(51) Int. Cl.
| | |
|---|---|
| *B60L 3/00* | (2019.01) |
| *H02J 7/00* | (2006.01) |
| *G01R 31/52* | (2020.01) |
| *B60L 53/62* | (2019.01) |
| *G01R 31/00* | (2006.01) |
| *H02H 9/08* | (2006.01) |

(52) U.S. Cl.
CPC .............. *B60L 53/62* (2019.02); *B60L 3/0069* (2013.01); *G01R 31/006* (2013.01); *G01R 31/52* (2020.01); *H02J 7/0029* (2013.01); *B60L 3/00* (2013.01); *H02H 9/08* (2013.01)

(58) Field of Classification Search
CPC ..... G01R 31/006; G01R 31/52; B60L 3/0069; B60L 53/62; H02J 7/0029
USPC ........................................................ 320/109
See application file for complete search history.

(56) References Cited

U.S. PATENT DOCUMENTS

| | | | | |
|---|---|---|---|---|
| 3,751,606 A | * | 8/1973 | Kaiser, Jr. .............. | G01R 31/08 379/22.03 |
| 3,758,763 A | * | 9/1973 | Nohara .................. | H03K 5/153 702/78 |
| 4,315,204 A | * | 2/1982 | Sievers ................ | G01R 31/007 322/99 |
| 4,739,274 A | * | 4/1988 | Kimball ................. | G01R 31/52 324/520 |
| 4,739,275 A | * | 4/1988 | Kimball ................. | G01R 31/52 324/529 |
| 4,929,901 A | * | 5/1990 | Kimball ................. | G01R 31/52 324/528 |

(Continued)

FOREIGN PATENT DOCUMENTS

| | | | | |
|---|---|---|---|---|
| CN | 102288834 A | * | 12/2011 | ............. G01R 31/52 |
| CN | 105899960 A | * | 8/2016 | ............. G01R 31/08 |

(Continued)

*Primary Examiner* — John T Trischler
(74) *Attorney, Agent, or Firm* — Leydig, Voit & Mayer, Ltd.

(57) ABSTRACT

A method for controlling a battery charger circuit of a vehicle. The method includes injecting a first current pulse between at least one line and a protective earth connection of the battery charger circuit. The method also includes measuring at least one line voltage value of at least one node of the battery charger circuit. The method also includes identifying a noise value by performing one or more operations on the battery charger circuit. The method also includes determining a protective earth connection impedance based on the at least one line voltage value and the noise value.

18 Claims, 5 Drawing Sheets

(56) References Cited

U.S. PATENT DOCUMENTS

| | | | |
|---|---|---|---|
| 5,060,166 A * | 10/1991 | Engel | H02H 3/50 |
| | | | 700/293 |
| 5,281,920 A | 1/1994 | Wurst | |
| 5,754,440 A * | 5/1998 | Cox | G01R 19/25 |
| | | | 361/85 |
| 5,821,757 A | 10/1998 | Alvarez et al. | |
| 6,265,881 B1 | 7/2001 | Meliopoulos et al. | |
| 6,593,871 B1 * | 7/2003 | Miethig | H03M 1/1255 |
| | | | 341/155 |
| 6,768,952 B2 * | 7/2004 | Kantorovich | G06F 11/24 |
| | | | 714/E11.154 |
| 7,075,311 B1 * | 7/2006 | Oshiro | G01R 31/1272 |
| | | | 324/557 |
| 7,089,127 B2 * | 8/2006 | Thibedeau | H02J 7/14 |
| | | | 702/63 |
| 7,362,074 B2 * | 4/2008 | Iwane | G01R 31/392 |
| | | | 320/132 |
| 7,657,386 B2 * | 2/2010 | Thibedeau | H02J 7/1461 |
| | | | 702/63 |
| 7,667,477 B2 | 2/2010 | Nagata | |
| 8,131,487 B2 * | 3/2012 | Thibedeau | G01R 31/389 |
| | | | 702/63 |
| 8,289,664 B2 * | 10/2012 | Haines | B60L 53/16 |
| | | | 361/42 |
| 8,922,056 B2 * | 12/2014 | Thisted | B60L 55/00 |
| | | | 307/46 |
| 9,312,724 B2 * | 4/2016 | Estes | H02J 7/35 |
| 9,599,650 B2 * | 3/2017 | Merienne | G01R 27/205 |
| 9,612,290 B2 * | 4/2017 | Chau | G01R 31/392 |
| 9,637,010 B2 * | 5/2017 | Merienne | B60L 53/00 |
| 9,718,374 B2 * | 8/2017 | Tang | B60L 50/60 |
| 9,969,290 B2 * | 5/2018 | Tang | H02J 7/345 |
| 10,386,419 B2 * | 8/2019 | Kanai | G01R 31/364 |
| 10,838,014 B2 * | 11/2020 | Swan | H02J 7/0048 |
| 10,905,365 B2 * | 2/2021 | Yang | A61B 5/1459 |
| 2003/0231456 A1 * | 12/2003 | Anthony | H01L 23/552 |
| | | | 361/302 |
| 2005/0156559 A1 * | 7/2005 | Thibedeau | G01R 31/389 |
| | | | 320/106 |
| 2006/0221531 A1 * | 10/2006 | Nagata | G01R 31/3173 |
| | | | 361/118 |
| 2007/0046261 A1 * | 3/2007 | Porebski | G01R 31/3865 |
| | | | 320/132 |
| 2010/0283546 A1 * | 11/2010 | Visser | H03F 3/605 |
| | | | 330/278 |
| 2010/0330875 A1 * | 12/2010 | Severson | A63H 19/24 |
| | | | 446/454 |
| 2011/0216451 A1 | 9/2011 | Haines et al. | |
| 2011/0266871 A1 * | 11/2011 | Thisted | H02J 7/34 |
| | | | 307/46 |
| 2013/0020985 A1 * | 1/2013 | Thibedeau | G01R 31/389 |
| | | | 320/107 |
| 2013/0057288 A1 * | 3/2013 | Ogata | G01R 33/02 |
| | | | 324/426 |
| 2013/0229156 A1 * | 9/2013 | Brandon | B60L 3/0046 |
| | | | 320/136 |
| 2014/0145854 A1 * | 5/2014 | Engel | G08B 13/1445 |
| | | | 340/650 |
| 2014/0368170 A1 * | 12/2014 | Tang | H02J 7/0063 |
| | | | 320/137 |
| 2015/0028818 A1 * | 1/2015 | Merienne | G01R 31/52 |
| | | | 320/137 |
| 2015/0042277 A1 * | 2/2015 | Tang | H02J 3/32 |
| | | | 320/109 |
| 2015/0077055 A1 | 3/2015 | Merienne | |
| 2015/0326035 A1 * | 11/2015 | Murayama | H02J 5/005 |
| | | | 307/104 |
| 2016/0109525 A1 * | 4/2016 | Chau | G01R 31/392 |
| | | | 324/426 |
| 2017/0110869 A1 * | 4/2017 | Bargues | H02H 1/003 |
| 2019/0004120 A1 * | 1/2019 | Swan | G01R 31/3662 |
| 2019/0288520 A1 * | 9/2019 | Abdel-Monem | H02J 7/0029 |
| 2020/0207209 A1 * | 7/2020 | Engel | B60R 16/033 |
| 2020/0212690 A1 * | 7/2020 | Engel | H02J 7/0029 |
| 2020/0212698 A1 * | 7/2020 | Engel | H02J 7/0068 |
| 2021/0050747 A1 * | 2/2021 | Daetwyler | H02J 50/90 |
| 2021/0063458 A1 * | 3/2021 | Engel | H02H 3/20 |
| 2021/0066953 A1 * | 3/2021 | Engel | B60L 53/62 |
| 2021/0129702 A1 * | 5/2021 | She | B60H 1/00428 |
| 2021/0237610 A1 * | 8/2021 | Zheng | H02J 7/0031 |
| 2021/0382114 A1 * | 12/2021 | Oyama | G01R 31/3835 |

FOREIGN PATENT DOCUMENTS

| | | | | |
|---|---|---|---|---|
| CN | 107110904 A | * | 8/2017 | G01R 31/52 |
| CN | 105492234 B | * | 12/2017 | B60L 3/0069 |
| EP | 1482317 A1 | * | 12/2004 | G01R 27/18 |
| FR | 2896883 A1 | * | 8/2007 | B60L 3/0069 |
| FR | 2986618 A1 | * | 8/2013 | B60L 3/00 |
| FR | 2990763 A1 | * | 11/2013 | B60L 53/14 |
| JP | 2002350488 A | * | 12/2002 | |
| JP | 2010521686 A | * | 6/2010 | |
| JP | 4663404 B2 | | 4/2011 | |
| KR | 101773947 B1 | * | 9/2017 | |
| KR | 102295910 B1 | * | 8/2021 | |
| KR | 102313121 B1 | * | 10/2021 | |
| WO | WO-0106267 A1 | * | 1/2001 | G01R 19/16542 |

\* cited by examiner

SYSTEMS AND METHODS FOR NOISE CANCELLATION IN PROTECTIVE EARTH RESISTANCE CHECK OF VEHICLE ONBOARD BATTERY CHARGER

TECHNICAL FIELD

This disclosure relates to vehicle onboard battery chargers and in particular to systems and methods for noise cancellation in protective earth resistance checks of vehicle onboard battery chargers.

BACKGROUND

Vehicles, such as cars, trucks, sport utility vehicles, crossovers, mini-vans, or other suitable vehicles, include a powertrain system that includes, for example, a propulsion unit, a transmission, drive shafts, wheels, and other suitable components. The propulsion unit may include an internal combustion engine, a fuel cell, one or more electric motors, and the like. A hybrid vehicle may include a powertrain system comprising more than one propulsion unit. For example, a hybrid vehicle may include an internal combustion engine and an electric motor that cooperatively operate to propel the vehicle.

In an electric powered vehicle, such as a hybrid vehicle or purely electric vehicle, one or more batteries supply power to one or more electric motors of the electric powered vehicle. Such batteries are typically charged when the electric power vehicle is not in use. For example, an operator of the electric powered vehicle may connect the vehicle to an electric grid (e.g., through a wall outlet in a home or other suitable connection to the electric grid). The electric grid may supply power to a battery charger circuit, which controls power flow to the one or more batteries in order to recharge the batteries.

SUMMARY

This disclosure relates generally to vehicle onboard battery charger systems and methods.

An aspect of the disclosed embodiments is a method for controlling a battery charger circuit of a vehicle. The method includes injecting a first current pulse between at least one line and a protective earth connection of the battery charger circuit. The method also includes measuring at least one line voltage value of at least one node of the battery charger circuit. The method also includes identifying a noise value by performing one or more operations on the battery charger circuit. The method also includes determining a protective earth connection impedance based on the at least one line voltage value and the noise value.

Another aspect of the disclosed embodiments is an apparatus for controlling a battery charger circuit of a vehicle. The apparatus includes a memory and a processor. The processor is configured to execute instructions stored on the memory to: inject a first current pulse between at least one line and a protective earth connection of the battery charger circuit; measure at least one line voltage value of at least one node of the battery charger circuit; identify a noise value by performing one or more operations on the battery charger circuit; and determine a protective earth connection impedance based on the at least one line voltage value and the noise value.

Another aspect of the disclosed embodiments is a non-transitory computer-readable storage medium that includes executable instructions that, when executed by a processor, facilitate performance of operations, comprising: injecting a first current pulse between at least one line and a protective earth connection of a battery charger circuit; measuring at least one line voltage value of at least one node of the battery charger circuit; identifying a noise value by: detecting a frequency and a phase of an incoming alternating current source associated with the battery charger circuit; detecting at least a zero crossing of a sine wave associated with the battery charger circuit; injecting a second current pulse between the at least one line and the protective earth connection of the battery charger circuit; initiating a sweep of an analog to digital converter sampling point; selectively adjusting a sampling window associated with measuring the at least one voltage value of the at least one node of the battery charger circuit; identifying an analog to digital converter delta time and adjusting the first current pulse based on the delta time; applying the first current pulse at the zero crossing of the sine wave associated with the battery charger circuit; and setting at least one current source associated with the battery charger circuit to zero amperes and verifying a pulse pattern associated with the first current pulse; and determining a protective earth connection impedance based on the at least one line voltage value and the noise value.

These and other aspects of the present disclosure are provided in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
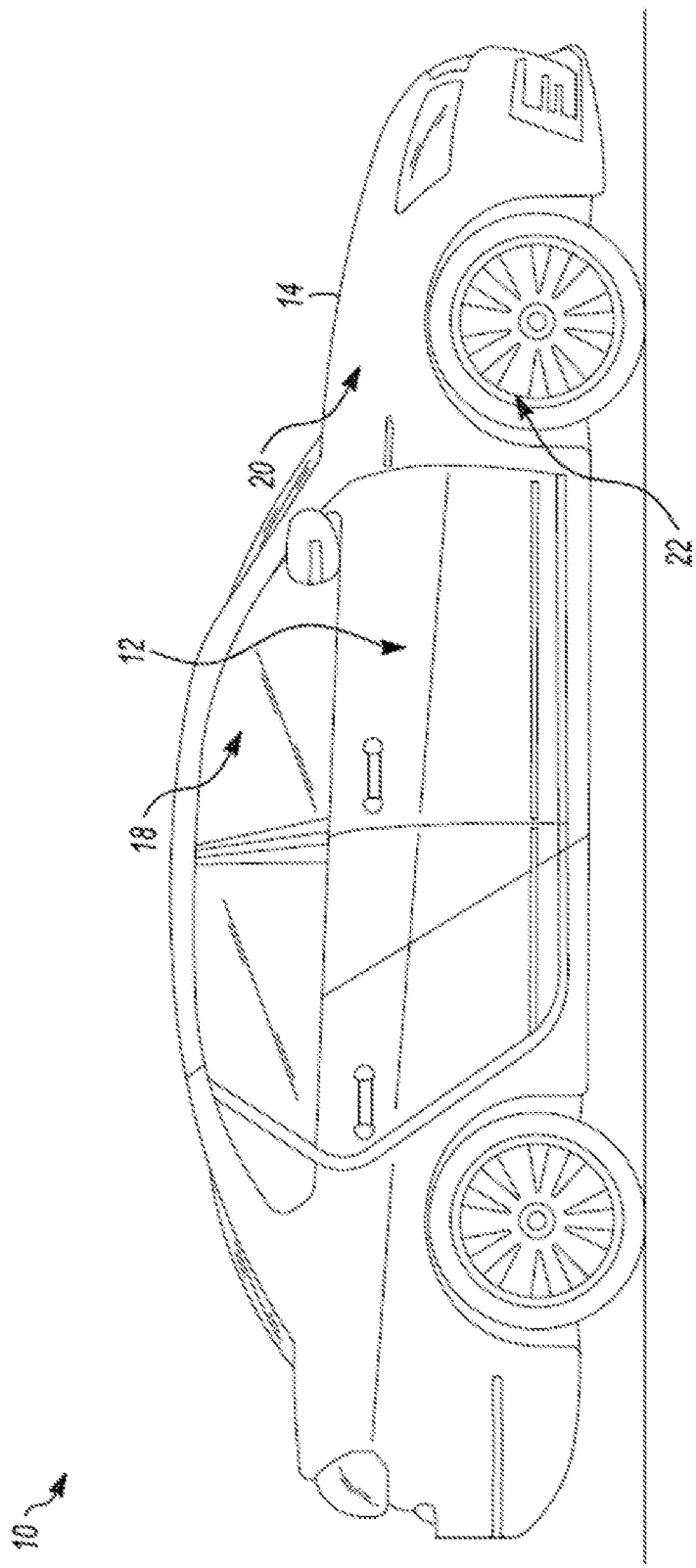
FIG. 1 generally illustrates a vehicle according to the principles of the present disclosure.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Vehicles, such as cars, trucks, sport utility vehicles, crossovers, mini-vans, or other suitable vehicles, include a powertrain system that includes, for example, a propulsion unit, a transmission, drive shafts, wheels, and other suitable components. The propulsion unit may include an internal combustion engine, a fuel cell, one or more electric motors, and the like. A hybrid vehicle may include a powertrain system comprising more than one propulsion unit. For example, a hybrid vehicle may include an internal combustion engine and an electric motor that cooperatively operate to propel the vehicle.

In an electric powered vehicle, such as a hybrid vehicle or purely electric vehicle, one or more batteries supply power to one or more electric motors (e.g., and various other components) of the electric powered vehicle. Such batteries are typically charged when the electric power vehicle is not in use. An operator of the electric powered vehicle may connect the vehicle to an electric grid. For example, the operator may connect a power cable to a wall outlet in a home, commercial location, or other suitable location to connect to the electric grid. The electric grid supplies alternating current power, which is converted to a set alternating current voltage at the wall outlet (e.g., 110 volts, 120 volts, 220 volts, 230 volts, or other suitable voltage value, which may vary based on region). The wall outlet, using power from the electric grid, supplies power to a battery charger circuit, which controls power flow to the one or more batteries in order to recharge the batteries.

Typically, such a battery charger circuit includes a protective earth connection, which provides a primary protection against touch currents and voltages on various components (e.g., conductive components, such as the chassis, body, and other metal or conductive components) of the vehicle. For example, during use (e.g., when the vehicle is connected to the electric grid), the protective earth connection is configured to reduce or maintain touch current and voltages, such that the operator is protected from dangerously high current values and voltage values when the operator comes in contact with the various components of the vehicle.

In typical systems, a controller of the vehicle may sense, measure, or monitor an impedance value of the protective earth connection. If the controller determines that the impedance value is above a threshold (e.g., too high), the controller may disconnect the battery charger circuit from and/or prevent the battery charger circuit from connecting to the wall outlet, to prevent power from flowing from the electric grid through the wall outlet to the battery charger circuit and causing dangerous touch currents and voltages.

The controller may measure the impedance value of the protective earth connection by injecting one or more known current values into the battery charger circuit and detecting a resulting voltage value. The injected current values and times at which they are injected, are selected, such that relative current protection devices of the vehicle are not triggered and the period of the test pulse (e.g., of the injected current values) is selected to provide a suitable range of reading and a reduced exposure to noise. Various solutions exist that use the readings (e.g., voltage sense (VSNS) readings, see FIG. 2) to suitably place the test pulse.

Such typical methods for monitoring the protective earth connection of a battery charger circuit and for determining whether to disconnect the battery charger circuit from or inhibit the connection to the electric grid (e.g., via the wall outlet) are typically limited to resistance measurements and typically do not account for noise in the battery charger circuit or other suitable noise in associated components. Accordingly, systems and methods, such as those described herein, configured to determine an impedance value of the protective earth connection while taking into account associated noise, may be desirable.

In some embodiments, the systems and methods described herein may be configured to, inject a first current pulse between at least one line and a protective earth connection of a battery charger circuit and measure at least one line voltage value of at least one node of the battery charger circuit. In some embodiments, the systems and methods described herein may be configured to identify a noise value associated with the battery charger circuit by: detecting a frequency and a phase of an incoming alternating current source associated with the battery charger circuit; detecting at least a zero crossing of a sine wave associated with the battery charger circuit; injecting a second current pulse between the at least one line and the protective earth connection of the battery charger circuit; initiating a sweep of an analog to digital converter sampling point; selectively adjusting a sampling window associated with measuring the at least one voltage value of the at least one node of the battery charger circuit; identifying an analog to digital converter delta time and adjusting the first current pulse based on the delta time; applying the first current pulse at the zero crossing of the sine wave associated with the battery charger circuit; and setting at least one current source associated with the battery charger circuit to zero amperes and verifying a pulse pattern associated with the first current pulse. In some embodiments, the systems and methods described herein may be configured to determine a protective earth connection impedance based on the at least one line voltage value and the noise value.

While examples of vehicle batteries are provided, the systems and methods described herein apply to any suitable battery and battery charger circuit. For example, mobile batteries and/or stationary batteries (e.g., independent of vehicle propulsion) may be charged using a similar battery charger circuit as those described herein. Such batteries may be used for energy storage, as auxiliary power units, as an interruptible power supply, or other suitable use. Such batteries may be charged in an earth-based system having power lines grounded to earth as a normal or an abnormal operating condition, similar to a fault tolerant IT grid.

Additionally, or alternatively, the systems and methods described herein can be combined with additional safety mechanisms specific to the grid the battery charger circuit is connected to (e.g., because the systems and methods described herein provide, at least, an improved capability to cancel or reduce the effect of other test pulses applied by other devices that are not synchronized with the battery charger circuit described herein).

FIG. 1 generally illustrates a vehicle 10 according to the principles of the present disclosure. The vehicle 10 may include any suitable vehicle, such as a car, a truck, a sport utility vehicle, a mini-van, a crossover, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles. The vehicle 10 includes a vehicle body 12 and a hood 14. A portion of the vehicle body 12 defines a passenger compartment 18. Another portion of the vehicle body 12 defines the engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position.

The passenger compartment 18 may be disposed rearward of the engine compartment 20. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system. In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a steering wheel, and other such components are disposed in the passenger compartment 18 of the vehicle 10. The propulsion controls may be actuated or controlled by a driver of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system.

In some embodiments, the vehicle 10 includes a transmission in communication with a crankshaft via a flywheel, clutch, or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles, which turns wheels 22.

When the vehicle 10 includes one or more electric motors, a vehicle battery, and/or fuel cell provides energy to the electric motors to turn the wheels 22. In cases where the vehicle 10 includes a vehicle battery to provide energy to the one or more electric motors, when the battery is depleted, it may be connected to an electric grid (e.g., using a wall socket) to recharge the battery cells. Additionally, or alternatively, the vehicle 10 may employ regenerative braking which uses the one or more electric motors of the vehicle 10 as a generator to convert kinetic energy lost due to decelerating back into stored energy in the battery.

The vehicle 10 may include automatic vehicle propulsion systems, such as a cruise control, an adaptive cruise control module or mechanism, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

Figure 2:
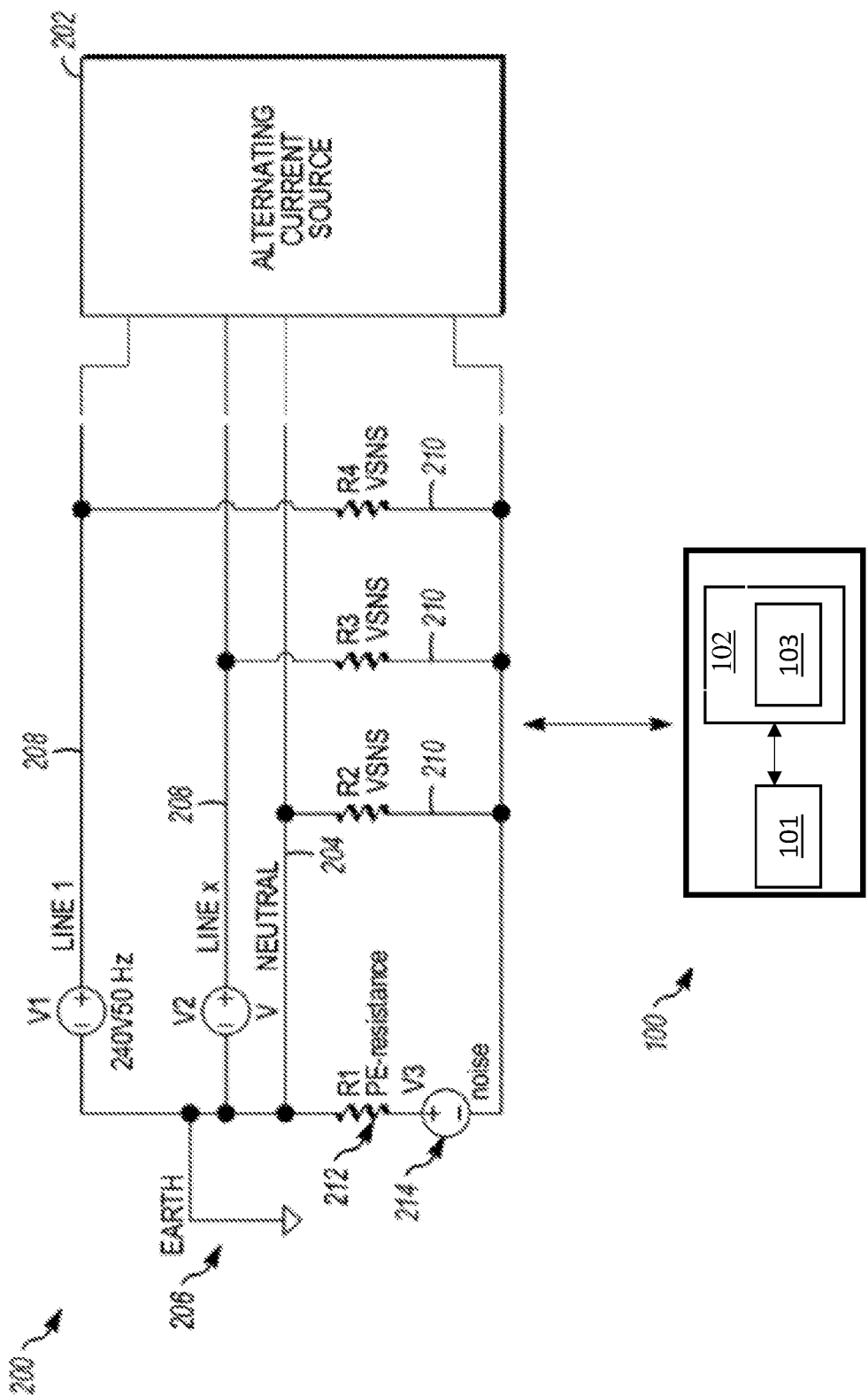
FIG. 2 generally illustrates a circuit diagram according to the principles of the present disclosure.

As described the vehicle 10 may include an electric powered vehicle, such as a hybrid vehicle or a purely electric vehicle. The vehicle 10, as described, may include one or more electric motors that receive power or energy from one or more batteries within the vehicle. The one or more batteries may include or be connected to respective vehicle onboard battery charger that provide power to respective batteries to recharge the respective batteries for use. FIG. 2 generally illustrates a battery charger circuit 200 in communication with a controller 100. The controller 100 may be any suitable controller within the vehicle, such as an electric control unit, a vehicle control unit, or other suitable vehicle onboard controller. The controller 100 may include a processor 101 and a memory 102 (which is a non-transitory computer-readable storage medium). The memory may be configured to store instructions 103 executable by the processor. For example, the processor may execute the instructions stored memory to perform various functions and methods described herein. The controller 100 may be configured to control various aspects of the vehicle. For example, the controller 100 may be configured to determiner an impedance value of a protective earth connection of the battery charger circuit 200 and selectively disconnect the battery charger circuit 200 from a power source or to or inhibit the connection between the battery charger circuit 200 and the power source.

As described, the battery charger circuit 200 may be associated with an onboard battery charger that supplies power to a respective battery of the vehicle 10 for recharging the respective battery. The battery charger circuit 200 may be connected to an alternating current source 202. The alternating current source 202 may include a wall outlet connected to an electric grid, as described. The alternating current source 202 provides alternating current power to the battery charger circuit 200. The battery charger circuit 200 may connect the alternating current power to various suitable power and may provide the power to the one or more batteries of the vehicle 10.

The alternating current source 202 may include any suitable phase type or scheme. For example, FIG. 3A generally illustrates a three-phase power source scheme and FIG. 3B generally illustrates a split-phase power source scheme. It should be understood that the alternating current source 202 may include any suitable phase type power source scheme.

Figure 3B:
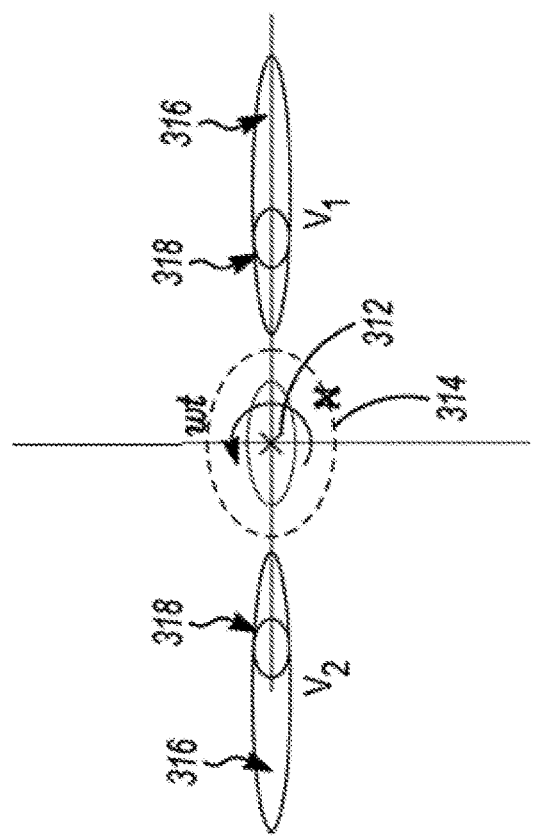
FIG. 3B generally illustrates a split-phase electrical system
Figure 3A:
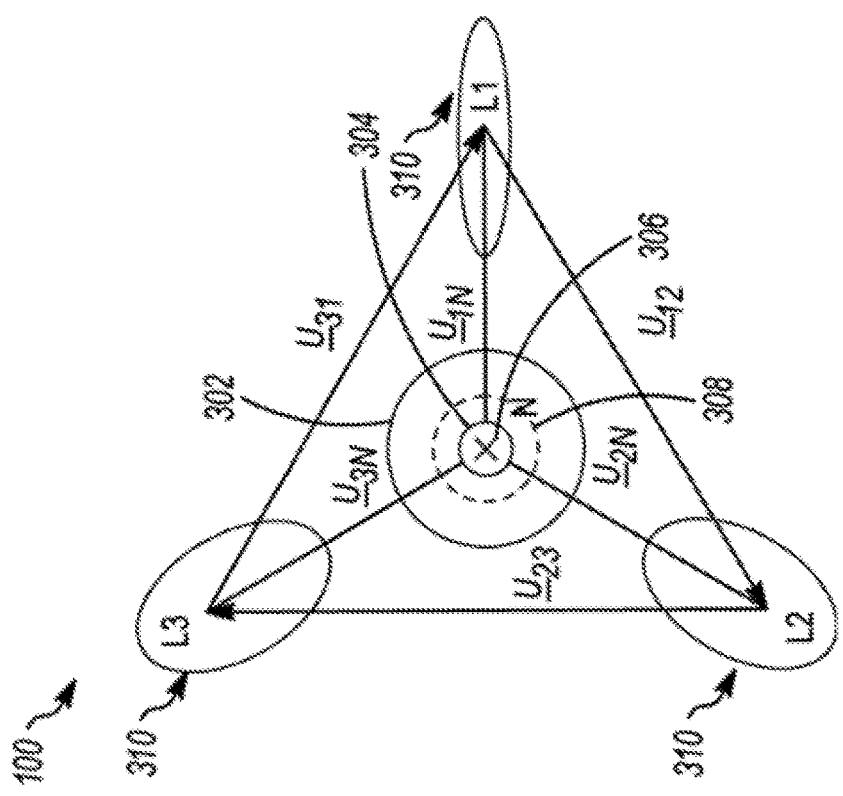
FIG. 3A generally illustrates three-phase electrical system according to the principles of the present disclosure.

With reference to FIG. 3A, a neutral line of the alternating current source 202 is illustrated at 302. The neutral line of the alternating current source 202 may be connected to a neutral line 204 of the battery charger circuit 200. An actual (e.g., measured) voltage range for the neutral line of the alternating current source 202 prior to an on state of the alternating current source 202 is illustrated at 304. The on state may include a state of alternating current source 202 corresponding to the alternating current source 202 providing power to the battery charger circuit 200 (e.g., in response to the battery charger circuit 200 being turned on to charge the battery). As described, the battery charger circuit 200 includes a protective earth connection 206. The protective earth connection 206 may be connected to an earth connection of the alternating current source 202. The earth connection expected voltage value range is illustrated at 306.

An acceptable voltage value limit (e.g., when the alternating current source 202 is in the on state) is illustrated at 308. The battery charger circuit 200 includes one or more lines 208. The one or more lines 208 may be connected to corresponding supply lines of the alternating current source 202. An expected voltage value range for supply lines associated with the alternating current source 202 is illustrated at 310. As described, the alternating current source 202 may include any suitable number of supply lines.

As described, FIG. 3B generally illustrates a split-phase scheme of the alternating current source 202. The battery charger circuit 200 may be connected to alternating current source 202 when the alternating current source 202 includes a split-phase scheme in a similar manner as described above with respect to FIG. 3A. An earth connection voltage value range is illustrated at 312 and may be similar or different from the earth connection voltage value range 306. An acceptable voltage value limit (e.g., when the alternating current source 202 is in the on state) is illustrated at 314 and may be similar or different from the acceptable voltage value limit 308. An expected voltage value range for supply lines associated with the alternating current source 202 is illustrated at 316 and may be similar or different from the expected voltage value range for supply lines 310. An actual (e.g., measured) voltage value range for the supply lines of the alternating current source 202 is illustrated at 318. The split-phase scheme does not typically include a neutral line. Accordingly, the controller 100 may derive a virtual neutral relative to the chassis of the vehicle. The controller 100 may derive the virtual neutral using the supply line voltages from the alternating current source 202

In some embodiments, the alternating current source 202 may include a power source scheme that includes power lines that are isolated from the earth (e.g., ground) and the connection between the vehicle 10 and the protective earth connection 206.

With reference to FIG. 2, the battery charger circuit 200 includes various resistors 210. In some embodiments, the battery charger circuit 200 includes a protective earth connection resistor 212. The battery charger circuit 200 may include noise 214 that may be caused by various components in the battery charger circuit 200, the alternating current source 202, the battery, or other components of the vehicle 10. The noise 214 may influence measurements taken by the controller 100 of the battery charger circuit 200.

In some embodiments, the controller 100 may measure impedance values of the protective earth connection 206, and may disconnect the battery charger circuit 200 from and/or prevent the battery charger circuit 200 from connecting to the alternating current source 202 when the controller 100 determines that the measured impedance values of the protective earth connection 206 are above a threshold. In some embodiments, the controller 100 may inject one or more known current values into the battery charger circuit 200. For example, the controller 100 may inject a first current pulse between at least one line 208 of the battery charger circuit 200 and the protective earth connection 206 of a battery charger circuit 200.

The controller 100 may measure a voltage value that results from the injected first current pulse. For example, the controller 100 may measure at least one line voltage value of at least one node of the battery charger circuit 200. The at least one node may include any suitable node or voltage sensing location of the battery charger circuit 200. As described, the battery charger circuit 200 may include noise, which may influence various measurements of the battery charger circuit 200. For example, the noise may influence the measurement of the voltage value resulting from the injected current pulses, which may ultimately influence a determined impedance value of the protective earth connection 206. Accordingly, the controller 100 may identify a noise value by performing one or more operations on the battery charger circuit 200. The noise value may be representative of all noise in the battery charger circuit 200.

In some embodiments, the controller 100 may identify the noise value by detecting a frequency and a phase of the incoming alternating current source 202. The controller 100 may identify the noise value by detecting at least a zero crossing of a sine wave associated with the battery charger circuit 200. The controller 100 may identify the noise value by detecting a top or bottom of the sine wave. The sine wave may represent the first current pulse injected into the battery charger circuit 200. The controller 100 may identify the noise value by injecting a second current pulse into the battery charger circuit 200. The controller 100 may identify the noise value by injecting the second current pulse between at least one line 208 of the battery charger circuit 200 and the protective earth connection 206 of a battery charger circuit 200. The second current pulse may be any suitable current pulse, include a zero amp current pulse, or other suitable current pulse.

The controller 100 may identify the noise value by initiating a sweep of an analog to digital converter sampling point. For example, the controller 100 may sweep the analog to digital converter sampling point in order to identify a time (e.g., sensing or measuring) window between reading boundaries that embrace an integer number of full cycles of the dominant base frequency of the noise source. For example only, this may be applied when the noise is known to be 50 hertz or 60 hertz, and the optimum noise cancellation may be achieved when the measurement uses 100 microsecond sensing (e.g., or measuring) window.

The controller 100 may identify the noise value by selectively adjusting a sampling window associated with measuring the at least one voltage value of the at least one node of the battery charger circuit 200. For example, the controller 100 may widen a window for measuring the voltage value resulting from the injected current pulse. The controller 100 may identify the noise value by identifying a delta time associated with the analog to digital convert and may adjust the first current pulse based on the delta time. The controller 100 may identify the noise value by applying the first current pulse at the zero crossing of the sine wave.

The controller 100 may identify the noise value by setting at least one current source associated with the battery charger circuit 200 to zero amperes. For example, the controller 100 may sent the alternating current source 202 to zero amperes and verify a pulse pattern of the first current pulse.

In some embodiments, the controller 100 may scan an identified area for a desired pulse to apply. The controller 100 may run a sampling in the area of the sine wave where the actual impedance measurement may be scheduled, but at no test current. The controller 100 may only read or measure the results that are influenced by the voltage source 214 (e.g., representing the source of the noise). A target voltage value measurement is equivalent to a very low impedance regardless of actual impedance because a test current pulse is not applied at that time. In case a measurement appears in the reading window can be adjusted, as described, and swept to find an optimal configuration. Since these noise sources are assumed constant over a usable interval, the actual impedance measurement can be scheduled after trimming a good result with a selected reading timing. The verification of the timing and the actual measurement can be interleaving in time.

It should be understood that the controller 100 may perform any suitable combination of the above-described operations in order to identifying the noise value including by performing all of the operations or some of the operations. Additionally, or alternatively, the controller 100 may iteratively repeat performance of the one or more operations on the battery charger circuit 200 to identify the noise value.

In some embodiments, the controller 100 may determine the protective earth connection impedance based on the at least one line voltage value and the noise value. For example, the controller 100 may adjust the measured voltage value using the identified noise value (e.g., to remove the influence of the noise over the voltage value). The controller 100 may calculate the impedance value using the voltage value.

In some embodiments, controller 100 may perform the methods described herein, such as the methods 400 and 500. However, the methods described herein as performed by the controller 100 are not meant to be limiting, and any type of software executed on a controller can perform the methods described herein without departing from the scope of this disclosure. For example, any suitable controller, such as a processor executing software within a computing device onboard the vehicle 10, can perform the methods described herein.

Figure 4:
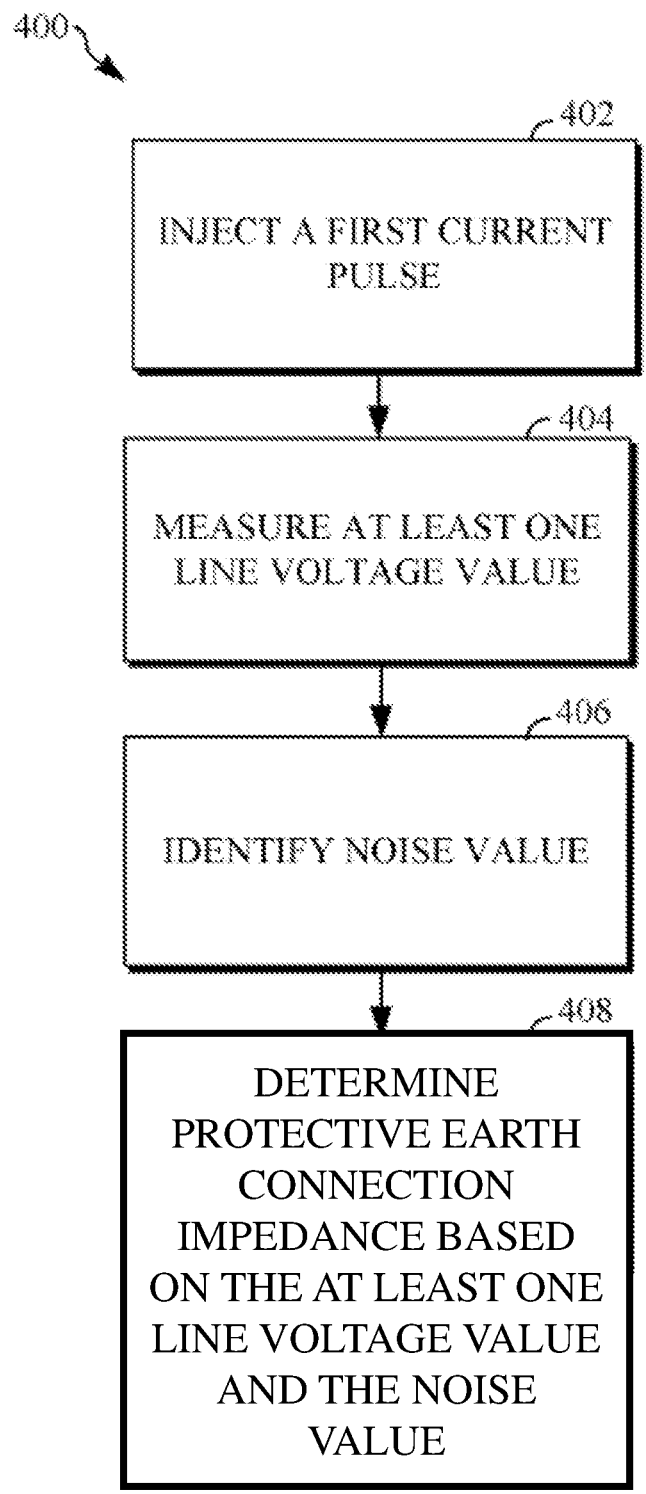
FIG. 4 is a flow diagram generally illustrating an impedance detection method according to the principles of the present disclosure.

FIG. 4 is a flow diagram generally illustrating an impedance detection method 400 for a protective earth connection, according to the principles of the present disclosure. At 402, the method 400 injects a first current pulse. For example, the controller 100 may inject the first current pulse between at least one line 208 and the protective earth connection 206 of the battery charger circuit 200. At 404, the method 400 measures at least one line voltage value. For example, the controller 100 may measure at least one line voltage of at least one node of the battery charger circuit 200. At 406, the method 400 identifies a noise value. For example, the controller 100 may identify the noise value by performing one or more operations on the battery charger circuit 200. At 408, the method 400 determines a protective earth connection impedance. For example, the controller 100 may determine the protective earth connection impedance based on the at least one line voltage value and the noise value. In some embodiments, the controller 100 may disconnect the battery charger circuit 200 from the incoming alternating current source 202 or may inhibit the connection between the battery charger circuit 200 and the incoming alternating current source 202, as described, based on a determination that the impedance value of the protective earth connection 206 is above a threshold.

Figure 5:
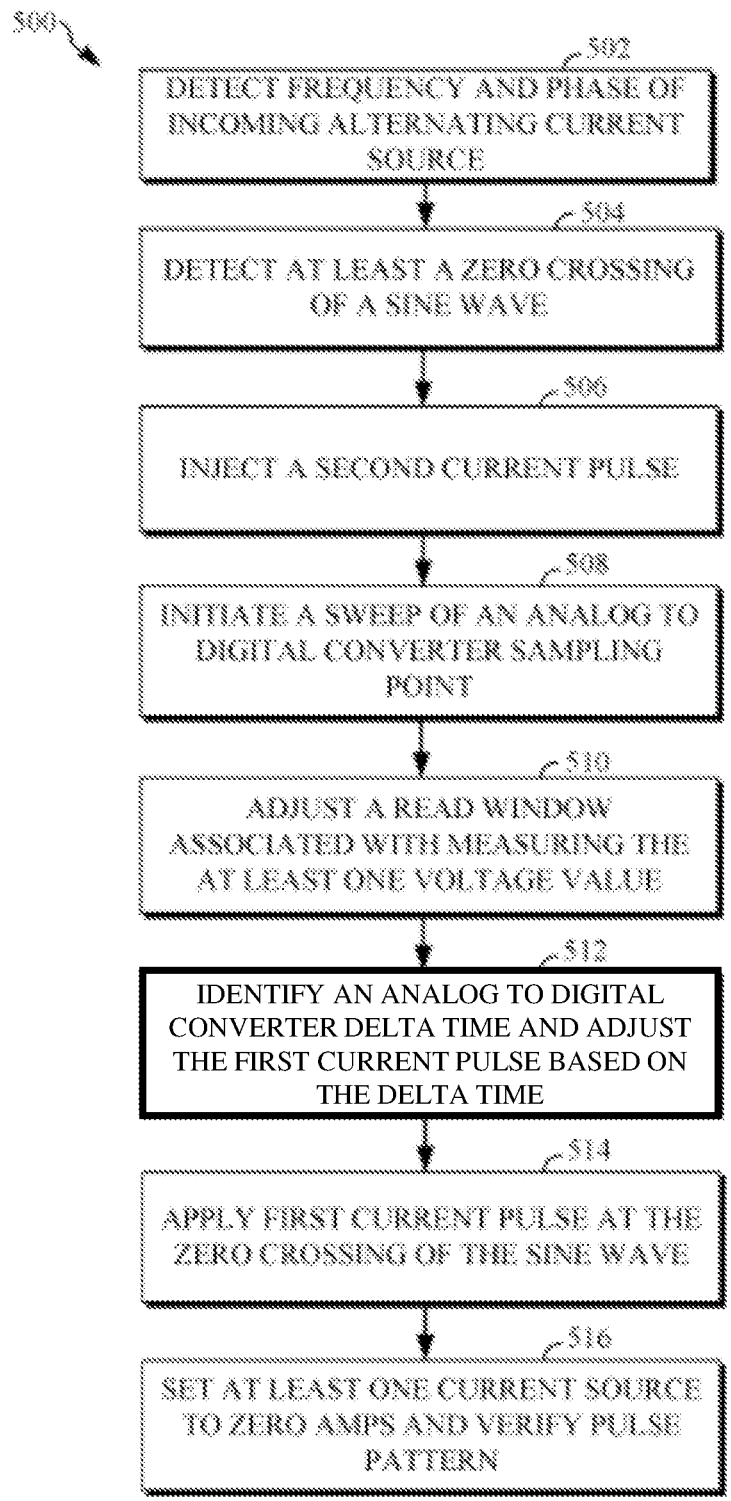
FIG. 5 is a flow diagram generally illustrating a noise detection method according to the principles of the present disclosure.

FIG. 5 is a flow diagram generally illustrating noise detection method 500 according to the principles of the present disclosure. At 502, the method 500 detects a frequency and a phase of an incoming alternating current source. For example, the controller 100 may detect a frequency and a phase of the incoming alternating current source 202. At 504, the method 500 detects at least a zero crossing of a sine wave. For example, the controller 100 may detect at least a zero crossing (e.g., or a top and/or a bottom) of the sine wave associated with the battery charger circuit 200. At 506, the method 500 injects a second current pulse. For example, the controller 100 may inject the second current pulse between the at least one line 208 and the protective earth connection 206. At 508, the method 500 initiates a sweep of an analog to digital converter sampling point. For example, the controller 100 initiates the sweep of an analog to digital converter sampling point. At 510, the method 500 selectively adjusts a sampling window associated with measuring the at least one voltage value. For example, the controller 100 selectively adjusts the sampling window associated with measuring the at least one voltage value of the at least one node of the battery charger circuit 200. At 512, the method 500 identifies an analog to digital converter delta time and adjusts the first current pulse based on the delta time. For example, the controller 100 identifies the analog to digital converter delta time and adjusts the first current pulse based on the delta time. At 514, the method 500 applies the first current pulse at the zero crossing of the sine wave. For example, the controller 100 may apply the first current pulse at the zero crossing of the sine wave associated with the battery charger circuit 200. At 516, the method 500 sets at least one current source associated with the battery charger circuit to zero amperes and verifies a pulse pattern. For example, the controller 100 may set the incoming alternating current source 202 to zero amperes and may verify the pulse pattern associated with the first current pulse.

In some embodiments, a method for controlling a battery charger circuit of a vehicle includes injecting a first current pulse between at least one line and a protective earth connection of the battery charger circuit. The method also includes measuring at least one line voltage value of at least one node of the battery charger circuit. The method also includes identifying a noise value by performing one or more operations on the battery charger circuit. The method also includes determining a protective earth connection impedance based on the at least one line voltage value and the noise value.

In some embodiments, the one or more operations includes detecting a frequency and a phase of an incoming alternating current source associated with the battery charger circuit. In some embodiments, the one or more operations includes detecting at least a zero crossing of a sine wave associated with the battery charger circuit. In some embodiments, the one or more operations includes injecting a second current pulse between the at least one line and the protective earth connection of the battery charger circuit. In some embodiments, the second current pulse equals zero. In some embodiments, the one or more operations includes initiating a sweep of an analog to digital converter sampling point. In some embodiments, the one or more operations includes selectively adjusting a sampling window associated with measuring the at least one voltage value of the at least one node of the battery charger circuit. In some embodiments, the one or more operations includes identifying an analog to digital converter delta time and adjusting the first current pulse based on the delta time. In some embodiments, the one or more operations includes applying the first current pulse at a zero crossing of a sine wave associated with the battery charger circuit. In some embodiments, the one or more operations includes setting at least one current source associated with the battery charger circuit to zero amperes and verifying a pulse pattern associated with the first current pulse.

In some embodiments, an apparatus for controlling a battery charger circuit of a vehicle includes a memory and a processor. The processor is configured to execute instructions stored on the memory to: inject a first current pulse between at least one line and a protective earth connection of the battery charger circuit; measure at least one line voltage value of at least one node of the battery charger circuit; identify a noise value by performing one or more operations on the battery charger circuit; and determine a protective earth connection impedance based on the at least one line voltage value and the noise value.

In some embodiments, the one or more operations includes detecting a frequency and a phase of an incoming alternating current source associated with the battery charger circuit. In some embodiments, the one or more operations includes detecting at least a zero crossing of a sine wave associated with the battery charger circuit. In some embodiments, the one or more operations includes injecting a second current pulse between the at least one line and the protective earth connection of the battery charger circuit, wherein the second current pulse equals zero. In some embodiments, the one or more operations includes initiating a sweep of an analog to digital converter sampling point. In some embodiments, the one or more operations includes selectively adjusting a sampling window associated with measuring the at least one voltage value of the at least one node of the battery charger circuit. In some embodiments, the one or more operations includes identifying an analog to digital converter delta time and adjusting the first current pulse based on the delta time. In some embodiments, the one or more operations includes applying the first current pulse at a zero crossing of a sine wave associated with the battery charger circuit. In some embodiments, the one or more operations includes setting at least one current source associated with the battery charger circuit to zero amperes and verifying a pulse pattern associated with the first current pulse.

In some embodiments, a non-transitory computer-readable storage medium includes executable instructions that, when executed by a processor, facilitate performance of operations, comprising: injecting a first current pulse between at least one line and a protective earth connection of a battery charger circuit; measuring at least one line voltage value of at least one node of the battery charger circuit; identifying a noise value by: detecting a frequency and a phase of an incoming alternating current source associated with the battery charger circuit; detecting at least a zero crossing of a sine wave associated with the battery charger circuit; injecting a second current pulse between the at least one line and the protective earth connection of the battery charger circuit; initiating a sweep of an analog to digital converter sampling point; selectively adjusting a sampling window associated with measuring the at least one voltage value of the at least one node of the battery charger circuit; identifying an analog to digital converter delta time and adjusting the first current pulse based on the delta time; applying the first current pulse at the zero crossing of the sine wave associated with the battery charger circuit; and setting at least one current source associated with the battery charger circuit to zero amperes and verifying a pulse pattern associated with the first current pulse; and determining a protective earth connection impedance based on the at least one line voltage value and the noise value.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A method for controlling a battery charger circuit of a vehicle, the method comprising:
    injecting a first current pulse signal having a pulse pattern between at least one line and a protective earth connection of the battery charger circuit;
    measuring at least one line voltage value of at least one node of the battery charger circuit;
    identifying a noise value of the battery charger circuit and adjusting the first current pulse signal or the measuring of the line voltage value by performing one or more operations on the battery charger circuit; and
    determining a protective earth connection impedance based on the at least one line voltage value and the noise value.

2. The method of claim 1, wherein the one or more operations includes detecting a frequency and a phase of an incoming alternating current source associated with the battery charger circuit.

3. The method of claim 1, wherein the one or more operations includes detecting at least a zero crossing of a sine wave associated with the battery charger circuit.

4. The method of claim 1, wherein the one or more operations includes, in a condition where the first current pulse signal is set to zero amps and where either zero amps or a second current pulse is injected between the at least one line and the protective earth connection of the battery charger circuit, measuring the noise value.

5. The method of claim 1, wherein the one or more operations includes initiating a sweep of an analog to digital converter sampling point.

6. The method of claim 1, wherein the one or more operations includes selectively adjusting a sampling window associated with measuring the at least one voltage value of the at least one node of the battery charger circuit.

7. The method of claim 1, wherein the one or more operations includes identifying an analog to digital converter delta time and adjusting the first current pulse signal based on the delta time.

8. The method of claim 1, wherein the one or more operations includes applying the first current pulse signal such that each pulse is at a zero crossing of a sine wave associated with the battery charger circuit.

9. The method of claim 1, wherein the one or more operations includes setting at least one current source associated with the battery charger circuit to zero amperes and verifying the pulse pattern associated with the first current pulse.

10. An apparatus for controlling a battery charger circuit of a vehicle, the apparatus comprising:
    a memory; and
    a processor configured to execute instructions stored on the memory to:
        inject a first current pulse signal having a pulse pattern between at least one line and a protective earth connection of the battery charger circuit;
        measure at least one line voltage value of at least one node of the battery charger circuit;
        identify a noise value and adjust the first current pulse signal or the measuring of the line voltage value by performing one or more operations on the battery charger circuit; and
        determine a protective earth connection impedance based on the at least one line voltage value and the noise value.

11. The apparatus of claim 10, wherein the one or more operations includes detecting a frequency and a phase of an incoming alternating current source associated with the battery charger circuit.

12. The apparatus of claim 10, wherein the one or more operations includes detecting at least a zero crossing of a sine wave associated with the battery charger circuit.

13. The apparatus of claim 10, wherein the one or more operations includes initiating a sweep of an analog to digital converter sampling point.

14. The apparatus of claim 10, wherein the one or more operations includes selectively adjusting a sampling window associated with measuring the at least one voltage value of the at least one node of the battery charger circuit.

15. The apparatus of claim 10, wherein the one or more operations includes identifying an analog to digital converter delta time and adjusting the first current pulse signal based on the delta time.

16. The apparatus of claim 10, wherein the one or more operations includes applying the first current pulse signal such that each pulse is at a zero crossing of a sine wave associated with the battery charger circuit.

17. The apparatus of claim 10, wherein the one or more operations includes setting at least one current source associated with the battery charger circuit to zero amperes and verifying a pulse pattern associated with the first current pulse.

18. A non-transitory computer-readable storage medium, comprising executable instructions that, when executed by a processor, facilitate performance of operations, comprising:
    detecting a frequency and a phase of an incoming alternating current source associated with a battery charger circuit;
    detecting at least a zero crossing of a sine wave associated with the battery charger circuit;
    controlling a current value to be zero amps, or injecting a current pulse, between at least one line and a protective earth connection of the battery charger circuit to determine a noise value;
    initiating a sweep of an analog to digital converter sampling point;
    selectively adjusting a sampling window associated with measuring at least one line voltage value of the at least one node of the battery charger circuit;
    identifying an analog to digital converter delta time and determining a current pulse signal having a pulse pattern based on the delta time;
    applying the current pulse signal such that each pulse of the pulse pattern is at the zero crossing of the sine wave associated with the battery charger circuit, each current pulse being injected between the at least one line and the protective earth connection of the battery charger circuit; and
    setting at least one current source associated with the battery charger circuit to zero amperes and verifying the pulse pattern associated with the current pulse;
    measuring the at least one line voltage value of at least one node of the battery charger circuit;
    determining a protective earth connection impedance based on the at least one line voltage value and the noise value.

* * * * *